US006593068B1

(12) United States Patent
Watanabe

(10) Patent No.: US 6,593,068 B1
(45) Date of Patent: Jul. 15, 2003

(54) CONCENTRATED DAMPENING WATER COMPOSITION FOR LITHOGRAPHIC PRINTING

(75) Inventor: Kuniharu Watanabe, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/709,547

(22) Filed: Nov. 13, 2000

(30) Foreign Application Priority Data

Nov. 10, 1999 (JP) .......................................... 11-319602

(51) Int. Cl.[7] ................................................ G03F 7/32
(52) U.S. Cl. ...................................................... 430/331
(58) Field of Search ......................................... 430/331

(56) References Cited

U.S. PATENT DOCUMENTS

| | | | | |
|---|---|---|---|---|
| 3,877,372 A | | 4/1975 | Leeds | 101/465 |
| 4,278,467 A | | 7/1981 | Fadner | 106/2 |
| 4,560,410 A | | 12/1985 | Burns et al. | 106/2 |
| 4,764,213 A | | 8/1988 | Gventer et al. | 106/2 |
| 5,221,330 A | * | 6/1993 | Matsumoto et al. | 106/2 |
| 5,296,336 A | * | 3/1994 | Doi et al. | 430/331 |
| 5,387,279 A | * | 2/1995 | Conti et al. | 106/2 |
| 5,637,444 A | | 6/1997 | Matsumoto | 430/331 |
| 5,720,800 A | * | 2/1998 | Matsumoto | 106/2 |
| 6,294,318 B1 | * | 9/2001 | Matsumoto et al. | 430/331 |

FOREIGN PATENT DOCUMENTS

| | | | |
|---|---|---|---|
| EP | 0441502 | | 8/1991 |
| GB | 1394938 | | 5/1975 |
| JP | 55-19757 | | 5/1980 |
| JP | 55-25075 | | 7/1980 |
| JP | 57-199693 | * | 12/1982 |
| JP | 58-5797 | | 2/1983 |

* cited by examiner

*Primary Examiner*—Hoa Van Le
(74) *Attorney, Agent, or Firm*—Burns, Doane, Swecker & Mathis, LLP

(57) ABSTRACT

A concentrated dampening water composition comprising an organic solvent having a solubility of 1 to 10% in water at 20° C., which composition comprises at least one selected from the group consisting of maleic acid and a salt thereof. The concentrated dampening water composition is stably solubilized, in spite of the existence of an organic solvent having a low water-solubility therein, and said composition does not have problems of foaming and deterioration of printing properties.

10 Claims, No Drawings

CONCENTRATED DAMPENING WATER COMPOSITION FOR LITHOGRAPHIC PRINTING

BACKGROUND OF THE INVENTION

1. Field of the Invention

The present invention relates to a concentrated dampening water composition useful for lithographic printing, and more specifically, to a concentrated dampening water composition which provides a dampening water composition useful for offset printing using a lithographic printing plate.

2. Description of the Prior Art

Lithographic printing technique makes the best use of the properties of water and an oil such that they are essentially incompatible with one another. The printing surface of a lithographic printing plate comprises areas which receive water and repel an oil ink and those which repel water and receive an oil ink, the former serving as non-image areas and the latter serving as image areas. The non-image areas become damp with damping water used in lithographic printing to thus enhance the difference in surface chemical properties between the image areas and the non-image area and hence to increase both the ink repellency of the non-image areas and the ink receptivity of the image areas.

As such dampening water, there have generally been known conventionally aqueous solutions containing alkali metal salts or ammonium salt of bichromic acid, phosphoric acid or salts thereof such as ammonium salt, and such a colloidal substance as gum arabic or carboxymethyl cellulose (CMC). However, it is difficult to uniformly dampen the non-image areas of lithographic printing plates with the above dampening water, and for this reason, the resultant printed matters are sometimes contaminated and a substantial skill in controlling the feed rate of the dampening water is required.

To overcome such disadvantages, there has been proposed the Dahlgren dampening system in which an aqueous solution containing about 20 to 25% of isopropyl alcohol is used as a dampening water. This method provides a variety of advantages concerning workability and accuracy of printed matters, such that the wettability of the non-image areas is improved that the amount of the dampening water can be reduced, that it is easy to control the balance between feed rates of printing ink and dampening water, that the amount of water emulsified into the printing ink is lowered and that the transfer of printing ink to the blanket is improved.

However, isopropyl alcohol is apt to evaporate, and therefore, the use of a special device is required for keeping the concentration thereof constant. This is unfavorable from the economical point of view. Moreover, isopropyl alcohol gives out bad smell and is toxic and thus the use thereof is not favorable in view of the pollution of working atmosphere.

In addition, even if the dampening water containing isopropyl alcohol is applied to offset printing in which a dampening molleton roller is commonly used, isopropyl alcohol evaporates from a roller surface and the printing plate surface. Therefore, it cannot show its own effects.

Moreover, the pollution with industrial waste has recently become a matter of great concern, the regulation with respect to discharge of chromium ions in waste water becomes much severer and there is a tendency of controlling the use of organic solvents such as isopropyl alcohol from the viewpoint of safety and hygiene. For this reason, it has been desired to develop a dampening water free of such a compound.

Under such circumstances, Japanese Patent Publication for Opposition Purpose (hereunder referred to as "J.P. KOKOKU") Nos. 55-25075. 55-19757 and 58-5797 disclose compositions containing a variety of surfactants which can only slightly reduce the surface tension of water. In general, the dampening water should have a surface tension ranges from 35 to 50 dyn/cm. Therefore, if these compositions are used as dampening water, it is necessary to substantially increase the concentration of surfactants in a dampening water. Furthermore, water is adhered to an ink film or an ink spreads over the surface of water because of vigorous movement of ink and/or water existing below an ink roll, a printing plate and a roll for supplying dampening water which rotate at a high speed, during the practical lithographic printing. However, combinations of surfactants disclosed in the foregoing methods explained above are insufficient to completely solve these problems. Besides, these dampening water containing such surfactants easily cause foaming during pumping and/or stirring thereof.

In addition, U.S. Pat. No 3,877,372 discloses a solution containing a mixture of ethylene glycol monobutyl ether and at least one of hexylene glycol and ethylene glycol. U.S. Pat. No. 4,278,467 discloses a dampening water containing at least one member selected from the group consisting of n-hexoxyethylene glycol, n-hexoxydiethylene glycol, 2-ethyl-1,3-hexanediol, n-butoxyethylene glycol acetate, n-butoxydiethylene glycol acetate and 3-butoxy-2-propanol. Japanese Patent Un-examined Publication (hereunder referred to as "J.P. KOKAI") No. 57-199693 (U.S. Pat. No. 4,560,410) discloses dampening water containing 2-ethyl-1,3-hexanediol and at least one member selected from the group consisting of completely water-soluble propylene glycol, ethylene glycol, dipropylene glycol, diethylene glycol, hexylene glycol, triethylene glycol, tetraethylene glycol, tripropane glycol and 1,5-pentanediol. As these dampening water compositions do not contain isopropyl alcohol, they are preferable in view of safety and hygiene. However, when an organic solvent having a low solubility in water such as 2-ethyl-1,3-hexanediol is used, it is unfavorable to obtain a concentrated dampening water or an additive for dampening water having high concentration.

In order to solve this problem, the use of surfactant is necessary, and on the other hand, the use of surfactant causes the problem of foaming and deterioration of printing properties.

Accordingly, it is desired to obtain a stable concentrated damping water composition which does not cause the problem of foaming or deterioration of printing properties.

SUMMARY OF THE INVENTION

Accordingly an object of the present invention is to provide a concentrated dampening water composition which is stably solubilized in spite of the use of an organic solvent having a low solubility in water therein, and which is free of the problem of foaming and deterioration of printing properties.

Under such circumstances, the inventors of this invention have conducted various studies on a concentrated dampening water composition for lithographic printing, and have found that maleic acid and a salt thereof exhibit an excellent solubilizing effect. Thus the inventors have completed the present invention.

Consequently, the present invention is directed to a concentrated dampening water composition for lithographic printing comprising an organic solvent having a solubility of 1 to 10% in water at 20° C., which composition comprises at least one selected from the group consisting of maleic acid and a salt thereof.

DESCRIPTION OF THE PREFERRED EMBODIMENTS

The present invention will be described in more detail below.

In the concentrated dampening water composition according to the present invention, at least one selected from the group consisting of maleic acid and a salt thereof (component (a)) is used. The examples of the salt of maleic acid used in the present invention include a lithium salt, a potassium salt, an ammonium salt, a monoethanol amine salt, a diethanol amine salt, a triethanol amine salt and the like.

Maleic anhydride can be used in the concentrated dampening water composition to exhibit the same effect as those of maleic acid or a salt thereof.

In the concentrated dampening water composition according to the present invention, the amount of at least one selected from the group consisting of maleic acid and a salt thereof suitably ranges from 0.5 to 10% by weight, and more preferably from 1 to 5% by weight. If the amount is less than 0.5% by weight, sufficient solubilizing effect on the organic solvent having a water-solubility of 1 to 10% is not obtained. On the other hand, if the amount is more than 10% by weight, the concentrated dampening water composition tends to evaporate and cause insoluble crystals when the composition is contacted with air for an extended time period.

As examples of the organic solvent having a solubility of 1 to 10% in water at 20° C. (compound (b)) used in the concentrated dampening water composition according to the present invention, there are specifically compounds represented by the following formula (I):

$$R^1—O—(—CH_2CH(CH_3)—O—)_m—H \qquad (I)$$

wherein $R^1$ represents an alkyl group having carbon atoms of from 1 to 4, and m represents an integer ranging from 1 to 3.

In the above formula (I), $R^1$ may be a straight chain alkyl group or a branched chain alkyl group, and they include propyl group, isopropyl group, n-butyl group, isobutyl group, t-butyl group and the like. Specific examples of the above compound are dipropylene glycol monopropyl ether, tripropylene glycol monopropyl ether, dipropylene glycol monoisopropyl ether, tripropylene glycol monoisopropyl ether, propylene glycol monobutyl ether, dipropylene glycol monobutyl ether, tripropylene glycol monobutyl ether, propylene glycol monoisobutyl ether, dipropylene glycol monoisobutyl ether, tripropylene glycol monoisobutyl ether, propylene glycol mono-tertiary-butyl ether, dipropylene glycol mono-tertiary-butyl ether, tripropylene glycol mono-tertiary-butyl ether and the like.

Among these, preferred are propylene glycol monobutyl ether, propylene glycol mono-tertiary-butyl ether, dipropylene glycol monopropyl ether, dipropylene glycol monobutyl ether and dipropylene glycol mono-tertiary-butyl ether.

Other compound (b) includes 2-ethyl-1,3-hexanediol, ethylene glycol monomethyl ether, diethylene glycol monomethyl ether, triethylene glycol monomethyl ether, polyethylene glycol monomethyl ether, ethylene glycol monoethyl ether, diethylene glycol monoethyl ether, triethylene glycol monoethyl ether, ethylene glycol monoisobutyl ether, diethylene glycol monoisobutyl ether, triethylene glycol monoisobutyl ether, ethylene glycol monopropyl ether, diethylene glycol monopropyl ether, triethylene glycol monopropyl ether, ethylene glycol monobutyl ether, ethylene glycol mono-tertiary-butyl ether, diethylene glycol monobutyl ether, diethylene glycol mono-tertiary-butyl ether, triethylene glycol monobutyl ether, triethylene glycol mono-tertiary-butyl ether and the like.

The above organic solvent may be used alone or in combination in the concentrated dampening water composition according to the present invention.

The amount of compound (b) in the concentrated dampening water composition suitably ranges from 10 to 90% by weight, and preferably from 20 to 80% by weight. If the amount is less than 10% by weight, sufficient wettability is not obtained when the composition is used as from 10 to 200-times diluted solution. On the other hand, if the amount is more than 90% by weight, it is not possible to dissolve other water-soluble components in the composition.

The concentrated dampening water composition may further contain an agent for improving the wettability of water supply rolls and for stabilizing water pickup (compound (C)), and such compounds include those represented by the following formula (II):

$$HO—(—CH_2CH(CH_3)—O—)_n—H \qquad (II)$$

wherein n represents an integer ranging from 1 to 5.

Among these, preferred are propylene glycol, dipropylene glycol and tripropylene glycol.

Other examples of compound (c) include 3-methoxy-3-methylbutanol; 3-methoxybutanol; ethylene glycol; diethylene glycol; triethylene glycol; butylene glycol; hexylene glycol; glycerin; diglycerin; polyglycerin; trimethylol propane; and methyl ether, propyl ether or butyl ether of polypropylene glycol having molecular weights ranging from 200 to 700. These compounds may be used alone or in combination.

The amount of agent for improving the wettability (compound (c)) in the concentrated dampening water composition suitably ranges from 1 to 50% by weight.

As compound (c), a surfactant may be used within the range wherein the problem of foaming or deterioration of printing properties does not occur.

Examples of anionic surfactants include fatty acid salts, abietic acid salts, hydroxyalkanesulfonic acid salts, alkanesulfonic acid salts, dialkyl sulfosuccinate salts, linear alkyl benzenesulfonate salts, branched alkyl benzenesulfonate salts, alkyl naphthalenesulfonate salts, alkylphenoxy polyoxyethylenepropyl-sulfonate salts, polyoxyethylene alkylsulfophenyl ether salts, sodium salt of N-methyl-N-oleyltaurine, disodium salt of N-alkylsulfosuccinic acid monoamide, petroleum sulfonic acid salts, sulfated castor oil, sulfated tallow, sulfuric acid ester salts of fatty acid alkyl esters, alkylsulfate ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphate ester salts, polyoxyethylenealkyl ether phosphoric acid ester salts, polyoxyethylenealkylphenyl ether phosphoric acid ester salts, partially saponified styrene-maleic anhydride copolymers, partially saponified olefin-maleic anhydride copolymers and condensates of naphthalene sulfonic acid salt and formalin. Among these, particularly preferred are dialkylsulfosuccinic acid salts, alkylsulfate ester salts and alkylnaphthalenesulfonic acid salts.

Examples of non-ionic surfactants include polyoxyethylene alkyl ethers, polyoxyethylene alkylphenyl ethers, polyoxyethylene polystyrylphenyl ethers, polyoxyethylene polyoxypropylene alkyl ethers, partial esters of glycerin-fatty acids, partial esters of sorbitan-fatty acids, partial esters of, pentaerythritol-fatty acids, propylene glycol monofatty acid ester, partial esters of sucrose-fatty acids, partial esters of polyoxyethylene sorbitan fatty acids, partial esters of polyoxyethylene sorbitol fatty acids, polyethylene glycol fatty acid esters, partial esters of polyglycerin fatty acids, castor oils modified with polyoxyethylene, partial esters of polyoxyethylene glycerin fatty acids, fatty acid diethanolamides, N,N-bis-2-hydroxyalkylamines, polyoxyethylene-alkylamines, triethanolamine fatty acid ester, polyoxyethylene-polyoxypropylene block copolymers, trialkylamine oxides, fluorine atom-containing surfactants and silicon atom-containing surfactants. Particularly preferred are polyoxyethylene alkylphenyl ethers, polyoxyethylene-polyoxypropylene block copolymers and the like, among others.

Further, other surfactants include silicon derivatives and fluorine derivatives.

The amount of the surfactant to be incorporated in the concentrated dampening water composition is not more than 10% by weight taking the foaming into consideration, and preferably 0.05 to 5% by weight based on the total weight of the composition. These surfactants may be used alone or in combination.

The concentrated dampening water composition of the present invention may further comprise a hydrophilic polymeric compound (compound (d)). Examples of such hydrophilic polymeric compound include gum arabic, starch derivatives, for instance, dextrin, enzyme-modified dextrin, hydroxypropylated enzyme-modified dextrin, carboxymethylated starch, starch phosphate and octenyl succinated starch, alginates or cellulose derivatives, for instance, carboxymethyl cellulose, carboxyethyl cellulose, methyl cellulose, and modified derivatives thereof; and such a synthetic substance as polyethylene glycol and copolymers thereof, polyvinyl alcohol and derivatives thereof, polyvinyl pyrrolidone, polyacrylamide and copolymers thereof, polyacrylic acid and copolymers thereof, vinyl methyl ether/maleic anhydride copolymers, vinyl acetate/maleic anhydride copolymers and polymer of styrenesulfonic acid and copolymers thereof. When polyvinyl pyrrolidone is used, at least one of those having molecular weights of from 200 to 3,000,000 may be used. Commercial products of such polyvinyl pyrrolidone include K-15, K-30, K-60, K-90 and K-120 which are manufactured by ISP Co., Ltd.

The suitable amount of the hydrophilic polymeric compound in the concentrated dampening water composition is not more than 20% by weight, and more preferably ranges from 0.2 to 10% by weight.

The concentrated dampening water composition according to the present invention may further comprise a pH-buffering agent (compound (e)). As compound (e), water-soluble organic acids, water-soluble inorganic acids and salts thereof can be used, and they exhibit a pH-controlling or buffering effect, an effect of properly etching the surface of a substrate for a lithographic printing plate or a corrosion-inhibitory effect. Examples of preferred organic acids are citric acid, ascorbic acid, malic acid, tartaric acid, lactic acid, acetic acid, gluconic acid, hydroxyacetic acid, oxalic acid, malonic acid, levulinic acid, sulfanilic acid, p-toluene sulfonic acid, phytic acid, organic phosphonic acid and the like. Examples of inorganic acids are phosphoric acid, polyphosphoric acid, nitric acid and sulfuric acid. Further, alkali metal salts, alkaline earth metal salts, ammonium salts and/or organic amine salts of the organic acids and/or the inorganic acids may also be used. These organic acids, inorganic acids and/or salts thereof may be used alone or in combination.

The amount of these organic, inorganic acids and/or salts thereof to be added to the concentrated dampening water composition preferably ranges from 0.5 to 10% by weight and is appropriately selected such that pH of the resulting dampening water ranges from 3 to 7 of acidic region. Alternatively, the dampening water composition can also be used in an alkaline region of pH 7 to 11 if alkali metal hydroxides, alkali metal phosphate, alkali metal carbonates and/or silicates are used as the pH-buffering component.

The concentrated dampening water composition of the present invention may further comprise chelating agents, coloring agents, antiseptic agents, anti-corrosion agents, acid esters, anti-foaming agents and the like.

Usually, the concentrated dampening water composition of the present invention is diluted with tap water or well water prior to use as dampening water. Tap water or well water generally contains ions such as calcium ions which exert adverse influences on printing and the presence thereof often causes contamination of printed matters. These problems can effectively be solved if the dampening water composition comprises a chelating agent. Examples of preferred chelating agents include ethylenediamine-tetraacetic acid and potassium or sodium salt thereof; diethylenetriamine-pentaacetic acid and potassium or sodium salt thereof; triethylenetetramine-hexaacetic acid and potassium or sodium salt thereof, hydroxyethyl ethylenediamine-triacetic acid and potassium or sodium salt thereof; nitrilotriacetic acid and potassium or sodium salt thereof; and such an organophosphonic acid as 1-hydroxyethane-1,1-diphosphonic acid, potassium or sodium salt thereof, aminotri(methylenephosphonic acid), potassium or sodium salt thereof; and phosphonoalkane tricarboxylic acid or salts thereof. Organic amine salts of the foregoing chelating agents may be used effectively instead of potassium and sodium salts thereof. These chelating agents should be selected so that they are stably present in the concentrated dampening water and exhibit no printing inhibitory effect. These chelating agents are used in the concentrated dampening water composition in an amount ranging from 0.1 to 10% by weight, and preferably 0.25 to 5% by weight.

As coloring agents used in the concentrated dampening water composition according to the present invention, food dyes are preferably used. For example, there are yellow dyes such as CI Nos. 19140 and 15985; red dyes such as CI Nos. 16185, 45430, 16255, 45380 and 45100; purple dyes such as CI No. 42640; blue dyes such as CI Nos. 42090 and 73015; green dyes such as CI No. 42095 and the like.

Examples of antiseptic agents used in the concentrated dampening water composition include benzisothiazoline-3-one, 4-isothiazoline-3-one derivatives, phenol or derivatives thereof, formalin, imidazole derivatives, sodium dehydroacetate, benzotriazole derivatives, amidine or guanidine derivatives, quaternary ammonium salts, pyridine, quinoline or guanidine derivatives, diazine or triazole derivatives, oxazole and oxazine derivatives, bromonitroalcohols such as bromonitro propanol, 2,2-dibromo-2-nitroethanol, 3-bromo-3-nitropentane-2,4-diol and the like. These antiseptic agent are used in such an amount that they can effectively and steadily inhibit the growth of bacteria, mold, yeast or the like and the amount thereof varies depending on the kinds of bacteria, mold, yeast or the like to be controlled but preferably ranges from 0.1 to 10% by weight on the basis of the total weight of the concentrated dampening water composition. In this respect, these antiseptic agents are preferably used in combination so that the composition is effective for controlling various kinds of mold, bacteria and yeast.

Examples of anti-corrosion agents are benzotriazole, 5-methylbenzotriazole, thiosalicylic acid, benzimidazole and derivatives thereof.

Preferred antifoaming agents which may be used in the concentrated dampening water composition of the present invention are silicone type ones and they may be in the form of either emulsion dispersions or solubilized solutions.

The concentrated dampening water composition according to the present invention may further comprise acid esters so as to improve working atmosphere, in particular the problem of odor. Such acid esters include those represented by the following formula (III):

$$R^2\text{—}COOR^3 \qquad \text{(III)}$$

wherein $R^2$ represents hydrogen atom, an alkyl, alkenyl or aralkyl group having carbon atoms of 1 to 15, or phenyl group; and $R^3$ represents an alkyl or aralkyl group having carbon atoms of 3 to 10 or phenyl group.

Specific examples are esters of formic acid, acetic acid, propionic acid, butyric acid, isobutyric acid, 2-ethyl butyric acid, valeric acid, isovaleric acid, 2-methyl valeric acid, hexanoic acid (caproic acid), 4-methyl pentanoic acid (isohexanoic acid), 2-hexenoic acid, 4-pentenoic acid, heptanoic acid, 2-methylheptanoic acid, octanoic acid (caplyric acid), nonanoic acid, decanoic acid (capric acid), 2-decenoic acid, lauric acid or myristic acid. The acid esters also include benzyl phenylacetate, and acetoacetic esters such as ethyl acetoacetate, 2-hexyl acetoacetate and the like.

Among these compounds, preferred are n-pentyl acetate, isopentyl acetate, n-butyl butyrate, n-pentyl butyrate and isopentyl butyrate, and especially preferred are n-butyl butyrate, n-pentyl butyrate and isopentyl butyrate.

These compounds may be used alone or in combination. The amount of these compounds in the concentrated dampening water composition ranges in general, from 0.0001 to 10% by weight, and more preferably from 0.001 to 1% by weight. It is possible to use additionally vanillic aldehyde, ethyl vanillic aldehyde and the like.

The remainder of the concentrated dampening water composition according to the present invention is water. The water which may be used is any of tap water, well water, distilled water and pure water, and most preferred for preparing a concentrated dampening water composition is pure water. The amount of water in the concentrated a dampening water composition may be one which is sufficient to dissolve the above-mentioned components, and in general it ranges from 30 to 70% by weight.

The concentrated dampening water composition is usually diluted 10 to 200 times with tap water or well water prior to the practical use, and the dampening water for practical use is obtained.

The concentrated dampening water composition of the present invention will hereunder be explained in more detail with reference to the following non-limitative working examples and comparative examples.

EXAMPLES 1 to 3

Comparative Examples 1 to 5

According to the compositions shown in Table 1, concentrated dampening water compositions 1 to 3 of the present invention, and comparative concentrated dampening water compositions 1 to 5 were prepared. The unit of numerical value is "% by weight". In preparing them, KOH or aqueous ammonia was added so that 3% diluted solution thereof had pH 5.

As for the concentrated dampening water compositions prepared above, it was observed whether the organic solvent having water-solubility of from 1 to 10% was sufficiently solubilized. Further, as for dampening water obtained by diluting the concentrated dampening water composition with tap water with a dilution ratio of 3%, foaming properties in a dampening water tank were observed. The results were summarized in Table 2. In Table 2, the symbol "○" denotes "not foaming" and the symbol "×" denotes "foaming" in evaluation of foaming.

TABLE 1

| | Examples | | | Comparative Examples | | | | |
|---|---|---|---|---|---|---|---|---|
| Component | 1 | 2 | 3 | 1 | 2 | 3 | 4 | 5 |
| Propylene glycol mono-n-butylether | 30.0 | 15.0 | — | 30.0 | 30.0 | 30.0 | 30.0 | 30.0 |
| Propylene glycol mono-t-butyl ether | — | 15.0 | 15.0 | — | — | — | — | — |
| Dipropylene glycol monopropyl ether | — | — | 15.0 | — | — | — | — | — |
| Propylene glycol | 30.0 | — | — | — | — | — | — | — |
| Dipropylene glycol | — | 30.0 | — | — | — | — | — | — |
| Tripropylene glycol | — | — | 30.0 | — | — | — | — | — |
| Maleic acid | 5.0 | 5.0 | 5.0 | — | — | — | — | — |
| Fumaric acid | — | — | — | 5.0 | — | — | — | — |
| Citric acid | — | — | — | — | 5.0 | — | — | — |
| Polyoxy-ethylene alkylether | — | — | — | — | — | 5.0 | — | — |
| Sodium dialkyl sulfosuccinate | — | — | — | — | — | — | 5.0 | — |
| Polyvinyl-alcohol | — | — | 1.0 | — | — | 1.0 | 1.0 | 1.0 |
| Polyvinyl pyrrolidone (K-15) | 1.0 | — | — | 1.0 | 1.0 | — | — | — |
| Ammonium phoshate | 0.3 | 0.3 | 0.3 | 0.3 | 0.3 | 0.3 | 0.3 | 0.3 |
| Ammonium nitrate | 1.0 | 1.0 | 1.0 | 1.0 | 1.0 | 1.0 | 1.0 | 1.0 |
| pH adjusting | KOH | * | * | KOH | KOH | * | * | — |
| Pure water | Up to 100 in total of the composition | | | | | | | |

In the column of pH adjusting, "*" denotes aqueous ammonia.

TABLE 2

| | Examples | | | Comparative Examples | | | | |
|---|---|---|---|---|---|---|---|---|
| | 1 | 2 | 3 | 1 | 2 | 3 | 4 | 5 |
| Solubilizing properties | ○ | ○ | ○ | X | X | X | ○ | X |
| Foaming in a dampening water tank | ○ | ○ | ○ | ○ | ○ | X | X | ○ |

As seen from the above results, it is found that maleic acid can be used to solubilize a concentrated dampening water composition comprising an organic solvent having a water-solubility of not more than 10%.

Fumaric acid which is a cis-trans isomer of maleic acid or citric acid is not suitable for solubilization. A nonionic surfactant, polyoxyethylene alkylether can not solubilize the composition. An anionic surfactant, sodium dialkyl sulfosuccinate can solubilize the composition, but it causes foaming in a dampening water tank and is obstacle in practical use.

Incidentally, in aspect of solubilization, KOH, LiOH or aqueous ammonium is preferably used in adjusting pH, in the concentrated dampening water composition of the present invention.

As mentioned above, in preparing a concentrated dampening water composition, maleic acid or a salt thereof can be used to exhibit a stable solubilizing effect on the concentrated dampening water composition, in spite of the use of an organic solvent having a low solubility in water in the composition. Accordingly, the concentrated dampening water composition of the present invention shows high stability, and does not cause the problems associated with foaming, and therefore the concentrated dampening water composition of the present invention is excellent in printing properties.

What is claimed is:

1. A concentrated dampening water composition for lithographic printing comprising an organic solvent having a solubility of 1 to 10% in water at 20° C., which composition comprises at least one selected from the group consisting of maleic acid and a salt thereof in an amount of from 0.5 to 10% by weight wherein the organic solvent having a solubility of 1 to 10% in water at 20° C. is present in an amount of from 10 to 90% by weight and is at least one selected from the group consisting of propylene glycol monobutyl ether, propylene glycol mono-tertiary-butyl ether, dipropylene glycol monopropyl ether, dipropylene glycol monobutyl ether, dipropylene glycol mono-tertiary-butyl ether, ethylene glycol monobutyl ether, and diethylene glycol monobutyl ether.

2. The concentrated dampening water composition for lithographic printing according to claim 1, wherein said salt of maleic acid is at least one selected from the group consisting of a lithium salt, a potassium salt, an ammonium salt, a monoethanol amine salt, a diethanol amine salt and a triethanol amine salt.

3. The concentrated dampening water composition for lithographic printing according to claim 1, which composition comprises at least one selected from the group consisting of maleic acid and a salt thereof in amount of from 1 to 5% by weight.

4. The concentrated dampening water composition for lithographic printing according to claim 1, which composition comprises the organic solvent having a solubility of 1 to 10% in water at 20° C. in amount of from 20 to 80% by weight.

5. The concentrated dampening water composition for lithographic printing according to claim 1, which further comprises the compound represented by the following formula (II):

$$HO—(—CH_2CH(CH_3)—O—)_n—H \quad (II)$$

wherein n represents an integer ranging from 1 to 5, and the amount of the compound of the formula (II) ranges from 1 to 50% by weight.

6. The concentrated dampening water composition for lithographic printing according to claim 1, which further comprises at least one selected from gum arabic, starch derivatives, alginates, cellulose derivatives, modified derivatives thereof, polyethylene glycol and copolymers thereof, polyvinyl alcohol and derivatives thereof, polyvinyl pyrrolidone, polyacrylamide and copolymers thereof, polyacrylic acid and copolymers thereof, vinyl methyl ether/maleic anhydride copolymers, vinyl acetate/maleic anhydride copolymers, polymer of styrenesulfonic acid and copolymers thereof in the amount of not more than 20% by weight.

7. The concentrated dampening water composition for lithographic printing according to claim 1, which further comprises polyvinylpyrrolidone.

8. The concentrated dampening water composition for lithographic printing according to claim 7, which comprises polyvinylpyrrolidone in amount of not more than 20% by weight.

9. The concentrated dampening water composition for lithographic printing according to claim 8, which comprises polyvinylpyrrolidone in amount of from 0.2 to 10% by weight.

10. A dampening water composition for lithographic printing, wherein the concentrated dampening water composition according to claim 1 is diluted from 10 to 200 times with tap water or well water.

* * * * *